(12) United States Patent
van Roijen

(10) Patent No.: US 6,894,336 B2
(45) Date of Patent: May 17, 2005

(54) VERTICAL ACCESS TRANSISTOR WITH CURVED CHANNEL

(75) Inventor: Raymond van Roijen, Hopewell Junction, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/171,255

(22) Filed: Jun. 12, 2002

(65) Prior Publication Data

US 2003/0230774 A1 Dec. 18, 2003

(51) Int. Cl.[7] .................. H01L 27/108; H01L 29/76; H01L 29/94; H01L 31/119; H01L 31/062
(52) U.S. Cl. ................... 257/302; 257/301; 257/328; 257/329; 257/330
(58) Field of Search ................. 257/301, 302, 257/328, 329, 330, 331

(56) References Cited

U.S. PATENT DOCUMENTS

| | | | |
|---|---|---|---|
| 4,830,978 A | | 5/1989 | Teng et al. |
| 4,901,128 A | * | 2/1990 | Sunami et al. ............. 257/302 |
| 5,225,697 A | * | 7/1993 | Malhi et al. ............... 257/302 |
| 5,404,038 A | | 4/1995 | Morihara |
| 6,150,688 A | * | 11/2000 | Maeda et al. .............. 257/302 |
| 6,188,096 B1 | | 2/2001 | Collins et al. |
| 6,320,215 B1 | | 11/2001 | Bronner et al. |
| 6,426,251 B2 | | 7/2002 | Bronner et al. |

FOREIGN PATENT DOCUMENTS

| | | |
|---|---|---|
| DE | 42 15 010 A1 | 11/1992 |
| EP | 1 071 129 A2 | 1/2001 |

* cited by examiner

Primary Examiner—Steven Loke
(74) Attorney, Agent, or Firm—Slater & Matsil, L.L.P.

(57) ABSTRACT

An access transistor (140) for a vertical DRAM device (110) and method of forming thereof. Trenches (114) are formed in a semiconductor wafer substrate (112), and storage capacitors (118) are formed in the bottom portion of the trenches (114). The trenches (114) are curved in a channel (130) region formed in a top portion of the trenches (114). The channel (130) is curved about a central point c, and the channel extends into the substrate (112) by a distance d along a radius b. A gate oxide (126) is disposed adjacent the curved channel (130), and a gate conductor (128) is disposed adjacent the gate oxide (126).

14 Claims, 2 Drawing Sheets

VERTICAL ACCESS TRANSISTOR WITH CURVED CHANNEL

TECHNICAL FIELD

The present invention relates generally to the fabrication of integrated circuits (IC's), and more particularly to the fabrication of memory IC's.

BACKGROUND

Semiconductor devices are used in a variety of electronic applications, such as personal computers and cellular phones, for example. One such semiconductor product widely used in electronic systems for storing data is a semiconductor memory, and a common type of semiconductor memory is a dynamic random access memory (DRAM).

A DRAM typically includes millions or billions of individual DRAM cells arranged in an array, with each cell storing one bit of data. A DRAM memory cell typically includes an access field effect transistor (FET) and a storage capacitor. The access FET allows the transfer of data charges to and from the storage capacitor during reading and writing operations. In addition, the data charges on the storage capacitor are periodically refreshed during a refresh operation.

DRAM storage capacitors are typically formed by etching deep trenches in a semiconductor substrate, and depositing and patterning a plurality of layers of conductive and insulating materials over the substrate in order to produce a storage capacitor that is adapted to store data, represented by a one or zero. Prior art DRAM designs typically comprise an access FET disposed in a subsequently deposited layer, disposed above and to the side of the storage capacitor.

The semiconductor industry in general is being driven to decrease the size of semiconductor devices located on integrated circuits. Miniaturization is generally needed to accommodate the increasing density of circuits necessary for today's semiconductor products. Decreasing the size of DRAM's creates manufacturing challenges.

More recent DRAM designs involve disposing the access FET directly above the storage capacitor, sometimes referred to as a vertical DRAM, which saves space by conserving surface area, and results in the ability to place more DRAM cells on a single chip. In vertical DRAM technology, the access FET is positioned vertically at the upper part of a deep trench.

SUMMARY OF THE INVENTION

Embodiments of the present invention achieve technical advantages as a vertical access transistor for a semiconductor memory device having a curved channel. By using the curved channel in accordance with embodiments of the invention, a variety of parameters of the FET may be altered, such as increasing or decreasing the threshold voltage and/or body factor, without changing the doping diffusion or requiring additional masking steps for additional diffusions.

In one embodiment, a semiconductor memory device includes a semiconductor wafer having a surface, and a plurality of trenches formed in the semiconductor wafer, the trenches including a top portion. A vertical access transistor is formed in the trench top portion, wherein the transistor includes a channel disposed substantially perpendicular to the semiconductor wafer surface, and wherein the channel is curved.

In another embodiment, a vertical access transistor for a semiconductor memory device includes a curved channel.

In another embodiment, a method of forming a vertical access transistor for a memory device includes providing a semiconductor wafer, and forming a plurality of trenches in the semiconductor wafer. The trenches include a top portion, and the trench top portion has a curved channel region for the vertical access transistor.

Advantages of embodiments of the invention include increasing or decreasing the threshold voltage and body factor of the transistor without affecting other parameters or changing process steps. The curved channel may be used to change the electric field at the gate oxide, e.g., to improve reliability. Furthermore, manufacturability is improved, by providing more flexibility in the selection of gate oxide thickness and channel doping levels.

BRIEF DESCRIPTION OF THE DRAWINGS

The above features of embodiments of the present invention will be more clearly understood from consideration of the following descriptions in connection with accompanying drawings in which:

FIG. 2 shows a top view of the vertical DRAM access transistor shown in FIG. 1a;

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Prior art vertical DRAMs will be discussed, followed by a description of some preferred embodiments of the present invention and some advantages thereof. One memory cell is shown in each figure, although many other memory cells and components of memory cells may be present in the semiconductor devices shown.

Figure 1:
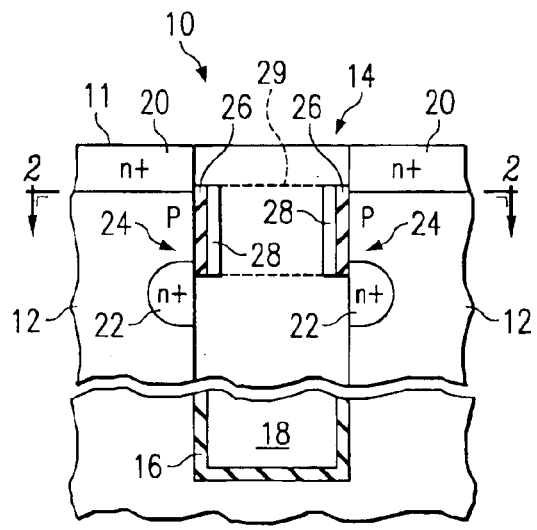
FIG. 1 shows a cross-sectional view of a prior art vertical DRAM access transistor.

FIG. 1 shows a cross-sectional view of a prior art vertical DRAM 10 having a channel 24 positioned vertically, on the sidewall of an etched trench 14 above a deep trench capacitor 18. The deep trench 14 is lined with an insulator 16 prior to depositing the capacitor 18 material. The transistor current is conducted in a direction perpendicular to the wafer surface 11 through the vertical channel 24, rather than parallel to the surface 11, as in horizontal MOSFET transistors.

Figure 2:
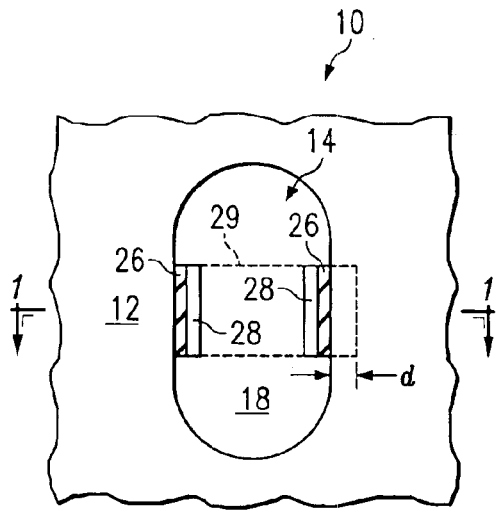

The vertical transistor 10 shown in FIG. 1 comprises a NMOS-type transistor, for example. FIG. 2 shows a top view of the etched trench shown in FIG. 1. The transistor is similar to a conventional horizontal NMOS transistor, with an n-doped source 20 disposed near the top surface of the substrate 12, and an n-doped drain 22 disposed beneath the channel 24. The drain 22 is also often referred to as a buried strap, for example. The trench 14 sidewall includes the p-doped channel 24 disposed between the source 20 and drain 22. A gate oxide 26 is disposed adjacent the channel 24. A gate conductor 28 comprising a polysilicon material, for example, is disposed adjacent the gate oxide 26. Alternatively, a single gate conductor 29 may be disposed adjacent the gate oxide, extending between the two gate oxides 26 on either side of the trench sidewalls, as shown in phantom. The properties of a vertical transistor 10 are similar to those of a conventional horizontal transistor with similar dimensions and diffusion properties.

The gate 28, gate oxide 26, and channel 24 of prior art vertical access FETs 10 are substantially rectangular in shape, as shown. While the trench 14 is substantially elliptical or oval in shape, the trench sidewalls are relatively straight in the region where the vertical access transistor 10 is formed. The width d indicated with a dashed line indicates the width of the depletion region or channel inside the p-silicon. In order to change the properties of prior art vertical FETs, the diffusion concentration must be changed, requiring additional manufacturing steps and mask levels.

Embodiments of the present invention achieve technical advantages as a DRAM having a vertical access transistor with a curved channel. The vertical access transistor channel is either convex or concave, which allows various properties of the transistor to be varied. The trench sidewalls may be curved prior to forming the gate oxide and gate of the vertical transistor. For example, the design of the trench itself may be curved, material may be added that is curved to the trench sidewall, or material may be removed from the trench sidewall to create the curve, to be discussed further herein.

Figure 3:
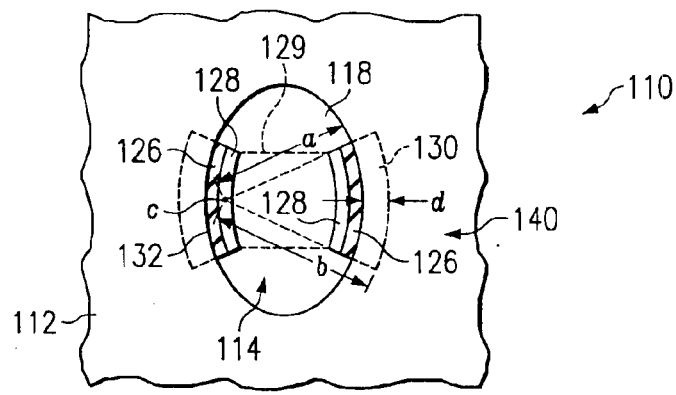
FIG. 3 shows a top view of an embodiment of the present invention wherein the vertical access transistor has a concave curved channel.

FIG. 3 shows a top view of a memory device having a vertical access transistor 110 with a concave curved channel 130 in accordance with an embodiment of the present invention. The term "concave", as used herein, refers to a curve in a channel that curves inwardly toward the center of the trench 114. In this embodiment, the trench 114 comprises a shape wherein the sidewalls are curved in the region where the gate oxide 126 and gate conductor 128 will be formed.

A preferred process for manufacturing the vertical DRAM device 110 of FIG. 3 will next be described. A semiconductor wafer workpiece 112 comprising a substrate is provided. The workpiece 112 typically comprises a semiconductor material such as single-crystal silicon, and may include other conductive layers or other semiconductor elements such as transistors or diodes, as examples. The workpiece 112 may alternatively comprise semiconductors such as GaAs, InP, Si/Ge, SiC, or other compound semiconductors, as examples.

A pad nitride, not shown, may be deposited over the semiconductor substrate 112. The pad nitride preferably comprises silicon nitride deposited in a thickness of 100–300 nm, as an example. Alternatively, the pad nitride may comprise other nitrides or oxides, as examples.

A plurality of trenches 114 is formed in the workpiece 112. The trenches 114 may have a high aspect ratio, e.g., the depth may be much greater than the width. For example, trenches 114 may be 100 nm wide and 10 $\mu$m deep below the top surface of the workpiece 112. The trenches 114 preferably have an oval or elliptical shape when viewed from the top surface of the wafer, although the trenches 114 may comprise other shapes. The trenches 114 form storage nodes or capacitors of memory cells, such as in a DRAM, for example.

A buried plate is formed, and a node dielectric is formed, not shown. The trenches are filled with collar oxide, and the trenches are filled with a semiconductor material 118 such as polysilicon, to form the capacitor inner plate and buried strap. The semiconductor material 118 is etched back to a predetermined distance below the workpiece 112 surface.

An insulating material is deposited over the polysilicon within the trench to cover the sidewalls. The insulating material preferably comprises an oxide such as $SiO_2$, as an example. A conductive material such as a semiconductor material is deposited over the insulating material. The conductive material may comprise polysilicon, for example, although other conductive materials may be used. The semiconductor material and insulating material are patterned and etched to form gate conductor 128 and gate oxide 126, respectively, adjacent the curved channel 130. The gate conductor 129 may alternatively extend between the two gate oxides 126 on either side of the trench 114, as shown in phantom.

In this embodiment, the trenches 114 are designed such that the sidewalls are curved in the region 132 where the gate oxide 126 and gate 128 will be formed. The curved substrate 112 creates a curved channel and depletion layer 130. The structure shown in FIG. 3 illustrates a concave channel 130 having a width d.

Advantageously, the curved channel 130 in accordance with embodiments of the present invention results in a different threshold voltage and body factor than the threshold voltage and body factor for a prior art straight channel structure shown in FIGS. 1 and 2. The body factor is the sensitivity of a transistor 140 when a voltage is applied from the body, e.g., the substrate 112. For a concave channel 130 shown in FIG. 3, the effect of the curvature on the NMOS properties can be understood qualitatively as the effect of an electric field increase, as in the case of a sharp conducting tip. Furthermore, a concave channel 130 results in an effective increase of the doping level (e.g., the charge within the region) within the depletion region d.

Thus, a concave channel 130 results in an increase in the threshold voltage and body factor of the transistor. A concave channel 130 also increases the electric field at the oxide/silicon interface.

An analysis of the effect of a concave curved channel 130 in accordance with embodiments of the present invention on the transistor 140 will next be discussed. A numerical calculation may be used to determine the change in threshold voltage and body factor as a result of the curved channel 130 of embodiments of the present invention. Referring to FIG. 3, the radius of curvature from a center point c of the curve to the oxide/silicon interface is indicated by distance a. The radius of curvature from the center point c to the outer edge of the channel 130 having a width d is indicated by distance b.

For the depletion layer 130 of a MOSFET, the relationship between the potential and the electric field can be represented by Equation 1:

$$d^2V/dx^2 = dE/dx = qN/\epsilon,\qquad\text{Eq. 1:}$$

where V is the potential, E is the electric field, q is the elementary charge, N is the doping concentration in the silicon and ∈ is the dielectric constant of the substrate 112 material, e.g., silicon.

For a transistor 140 having a concave channel 130, the electric field E may be calculated by Equation 2:

Eq. 2: $E = \int dE/dx \, dx = 1/a \int qNr/\varepsilon \, dr,$ or:

Eq. 3: $= 1/a \, qN/\varepsilon \, [(b^2 - a^2)/2],$ where a represents a radius from a center point c of the curve to the oxide/silicon interface, and b represents the radius from the curve center point c to the edge of the depletion layer or channel 130 in the substrate 112, as illustrated in FIG. 3.

The potential is the integral of the field, represented by Equation 4:

Eq. 4: $\Psi = \int E \, dr = \int 1/a \, qN/\varepsilon[(r^2 - a^2)/2] dr$ $= 1/a \, qN/\varepsilon \, [1/6 \, r^3 - 1/2 \, ra^2]_a^b,$ or:

Eq. 5: $= qN/\varepsilon \, (1/6 \, b^3/a - ba/2 + a^2/3).$

If the depletion layer width d is much smaller than the radius a, then:

$b = a + d => \Psi = qN/\in(d^3/6a + d^2/2).$  Eq. 6:

At threshold, the potential is equal to twice the flatband voltage $\phi_f$, and the depletion layer thickness $d_{th}$ may be determined by Equation 7:

$d_{th}: qN/\in(d^3/6a + d^2/2) = 2\phi_f.$  Eq. 7:

The voltage over the oxide is given by Equation 8:

$V_{ox} = K\sqrt{(2\phi_f)}.$  Eq. 8:

If d<<a, the body factor K is approximately equal to that shown in Equation 9:

$K \approx 1/C_{ox}(\sqrt{(2\in qN)} + \sqrt{(2\phi)} \in /a);$  Eq. 9:

where $C_{ox}$ is the capacitance of the gate oxide 126, which can be calculated by $C_{ox} = \in A/t$, where A is the area of the gate oxide 126 and t is the thickness of the oxide. The body factor K for a concave channel 130 is higher than the body factor K for a conventional, flat (e.g., straight) channel, which may be calculated by Equation 10:

$K = 1/C_{ox}\sqrt{(2\in qN)}$  Eq. 10:

The equations may be solved numerically, e.g., without the need for d<<a. In a typical example, with a gate oxide 126 thickness comprising 6.6 nm, and having a channel 130 doping concentration in the channel of $7.10^{17}$ cm$^{-3}$ and a radius of curvature b of 100 nm, the calculations yield a body factor K of 1.02 V$^{1/2}$ and a threshold voltage V$_{th}$ of 0.42 V. A comparable conventional, flat channel would have a body factor K of 0.92 V$^{1/2}$ and a threshold voltage V$_{th}$ of 0.34 V, for example. Therefore, the body factor and threshold voltage may be increased using a vertical access transistor 140 having a concave curved channel 130 as shown in FIG. 3, in accordance with an embodiment of the present invention.

Figure 4A:
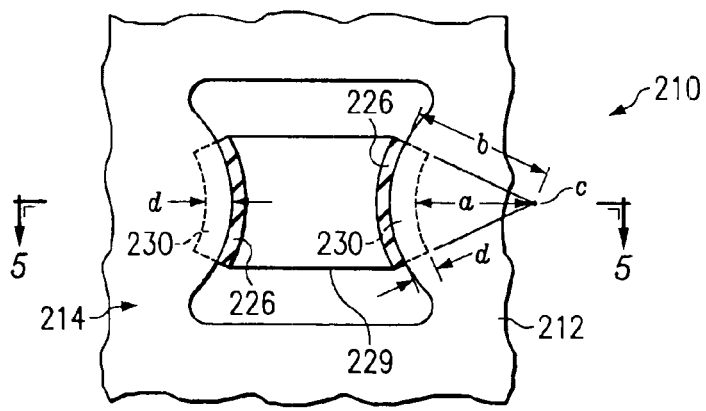
FIG. 4a shows a top view of an embodiment having a convex curved channel vertical access transistor.

An embodiment of a vertical access transistor 240 having a convex curved channel 230 is shown in a top view in FIG. 4a. Preferably, when the trench 214 is formed using lithography, the trench 214 shape includes a convex curved channel 230. Thus, no additional processing steps are required to produce the curved channel 230. Gate oxide 226 and gate conductor 229 are formed adjacent the channel 230. In the embodiment shown, gate conductor 229 extends completely between the gate oxides 226 on either side of the trench 214. Alternatively, the gate conductor may not extend completely between the gate oxides 226, for example.

The gate oxide 226 and the gate conductor 228 also comprise a convex curve, e.g., the channel 230, gate oxide 226 and gate conductor 229 curve outwardly away from the trench 214 about a center point c. The radius of curvature b comprises the width d of the channel 230 or depletion region and the distance a between the center point c of the curve and the edge of the channel 230.

Figure 4B:
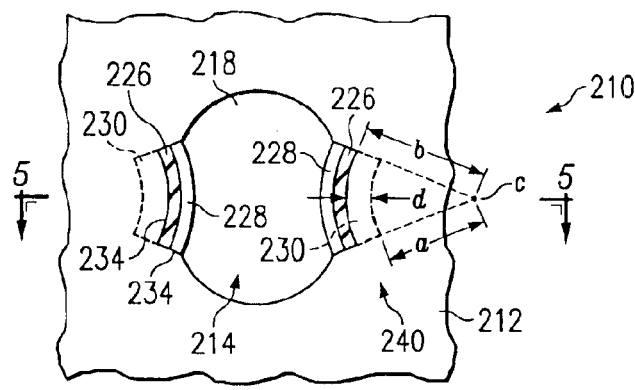
FIG. 4b shows a top view of an embodiment wherein a portion of the substrate at the top of the trench is removed prior to forming the convex curved channel vertical access transistor.

Alternatively, to form the curved channel 230, a portion of the substrate 212 may be removed e.g. at 234, as shown in FIG. 4b. Similar to the process described for FIG. 4a, gate oxide 226 and gate conductor 228 are formed adjacent the channel 230. The gate oxide 226 and the gate conductor 228 also comprise a convex curve, e.g., the channel 230, gate oxide 226 and gate conductor 228 curve outwardly away from the trench 214 about a center point c. In the embodiment shown, gate conductor 228 does not extend completely between the gate oxides 226, although alternatively, the gate conductor may extend completely between the gate oxides 226, as shown in FIG. 4a. Again, the radius of curvature b comprises the width d of the channel 230 or depletion region and the distance a between the center point c of the curve and the edge of the channel 230.

Figure 5:
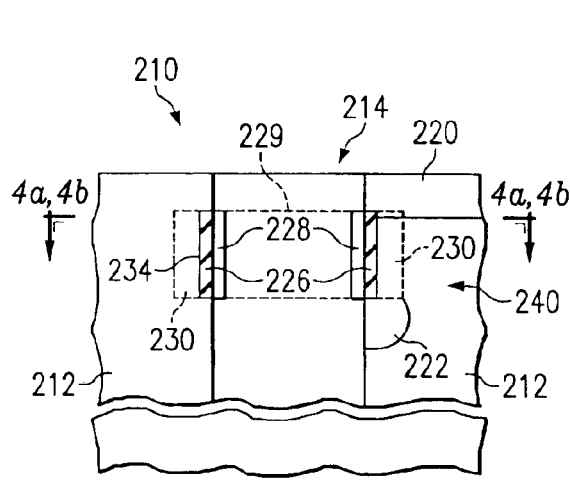
FIG. 5 is a cross-sectional view of the embodiment shown in FIGS. 4a and 4b.

The equations for a vertical access transistor 240 having a convex curved channel 230 are similar to those for a concave curved channel 130 of FIG. 3, but with a different sign. For example, the potential may be calculated using Equation 11:

$\Psi = qN/\in(d^2/2 - d^3/6a)$  Eq. 11 and the body factor can be calculated using Equation 12:

$K \approx 1/C_{ox}(\sqrt{(2\in qN)} - \sqrt{(2\phi)}\in/a)$  Eq. 12:

FIG. 5 shows a cross-sectional view of the embodiments shown in FIGS. 4a and 4b. The n-type regions 220 and 222 may comprise source/drain regions, respectively. Channel 230 may be doped with p-type material. A storage capacitor (not shown) is formed in the lower portion of the trench 214.

For a convex channel 230, shown in FIGS. 4a and 4b, for a radius of curvature b of 100 nm, the calculations yield a body factor K of 0.80 V$^{1/2}$ and a threshold voltage V$_{th}$ of 0.25 V. Therefore, comparing these values to those of a conventional, flat channel, the body factor and threshold voltage may be decreased using a convex curved channel.

Figure 6:
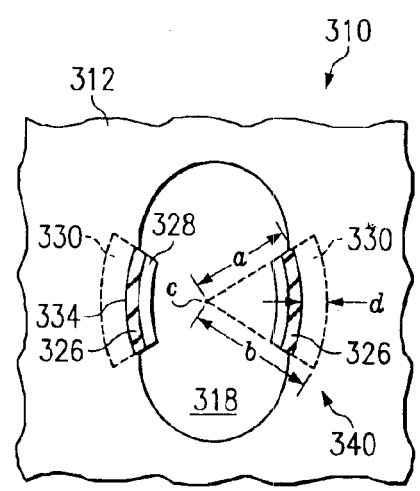
FIG. 6 shows a top view of another embodiment having a concave curved channel vertical access transistor.

FIG. 6 shows a top view of another embodiment of the present invention having a concave curved channel vertical access transistor 340. In this embodiment, a portion of the substrate 312 is removed to form a curved area 334, and the gate oxide 326 and gate conductor 328 are formed adjacent the substrate curved area 334. The same Equations apply as Equations 1 through 10 described above for FIG. 3.

Figure 7:
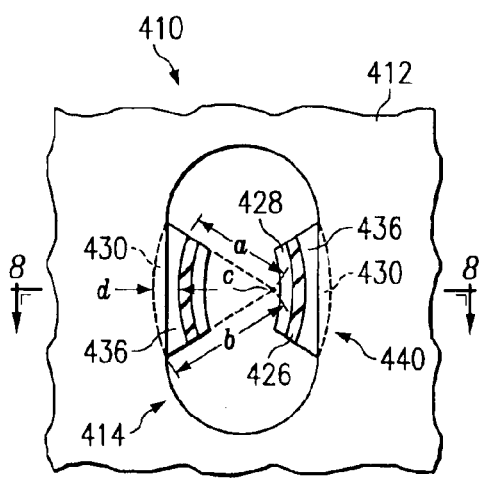
FIG. 7 shows a top view of an embodiment wherein additional material is added to the trench sidewall prior to forming a concave curved channel vertical access transistor.
Figure 8:
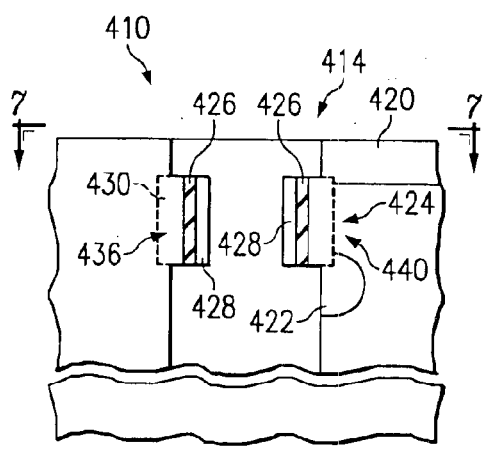
FIG. 8 illustrates a cross-sectional view of the embodiment shown in FIG. 7.

In another embodiment 410 of the invention, shown in a top view in FIG. 7, semiconductor material 436 may be added to the substrate 412 prior to forming the curved channel region 430. For example, silicon material 436 may be grown over the trench 414 sidewalls after other areas are masked with an oxide. An excess amount of additional material 436 may be deposited, and then etched to produce the desired shape and thickness, for example. FIG. 8 illustrates a cross-sectional view of the embodiment 410 shown in FIG. 7.

Similar to the other embodiments described herein, the gate conductor 328/428 may alternatively extend completely between the gate oxides 326/426 for the embodiments shown in FIGS. 6–8 (not shown).

Further processing is continued to complete the vertical DRAM 110/210/310/410 device. For example, an insulating material may be deposited to fill the trenches 114/214/314/414 and form shallow trench isolation (STI). Subsequent material layers may be deposited and patterned.

Preferably, the radius of curvature b is selected such that the effect on the body factor K is between about −0.04 to −0.20 $V^{1/2}$, for example, for a convex channel, and about +0.02 to +0.20 $V^{1/2}$, for example, for a concave channel. The effect on the threshold voltage $V_{th}$ is preferably between about −0.015 to −0.18 V, as examples (for a convex channel), and preferably between about +0.03 to +0.15 V, as examples (for a concave channel). Furthermore, in accordance with embodiments of the invention, the radius of curvature b is preferably between about 60 to 250 nm (for a convex channel), and preferably between about 50 to 300 nm (for a concave channel), as examples.

Embodiments of the present invention achieve technical advantages by providing a curved channel 130/230/330/340 that is adapted to increase or decrease the threshold voltage and body factor of a vertical access transistor 140/240/340/440. The concave channel 130/330/340 described herein also results in an increased electric field at the oxide/silicon interface.

A vertical transistor having a curved channel provides more freedom in designing devices with specific properties for designs of memory cells or other applications. For example, the threshold voltage may be changed without changing the channel doping. Devices with different threshold voltages may be manufactured without requiring additional masking steps for additional diffusions. Advantageously, the electric field may be changed at the gate oxide to improve reliability. Manufacturability is improved because of the increased flexibility in selecting the gate oxide thickness and/or channel doping level, provided by embodiments of the present invention.

Furthermore, because the channel 130/230/330/430 resides on the sidewall of the trench 114/214/314/414, rather than on the surface of a wafer, as in horizontal DRAM technology, the channel 130/230/330/430 may be shaped into a curved shape, in accordance with embodiments of the present invention.

While embodiments of the present invention are described herein with reference to DRAM devices, they also have useful application in other semiconductor devices. Embodiments of the present invention have application in memory devices utilizing N-MOSFET and P-MOSFET type transistors, as examples. Embodiments of the invention may also be used in other structures where the technology allows formation of a curved channel, for instance if a vertical structure is formed on top of a semiconductor wafer.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of embodiments of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A memory device comprising:
    a semiconductor wafer having a surface;
    a plurality of trenches formed in the semiconductor wafer, each trench including a top portion, and each trench having a first sidewall that is convexly curved and a second sidewall that is not convexly curved;
    a plurality of vertical access transistors, each transistor formed in the top portion of one of the trenches, wherein the transistor includes a curved channel disposed substantially perpendicular to the semiconductor wafer surface and wherein each vertical access transistor comprises a source region and a drain region formed in the semiconductor wafer disposed along the convexly curved sidewall of the trench, each transistor further including a gate insulating layer formed only along the convexly curved sidewall of the trench and a gate conductor formed in contact with the gate insulating layer, wherein the curved channel is disposed vertically between the source and drain regions and along the convexly curved sidewall of the trench so that the channel is convex.

2. The memory device according to claim 1, wherein each trench include a bottom portion disposed beneath the trench top portion, the memory device further comprising a storage capacitor formed in each trench bottom portion.

3. The memory device according to claim 2, wherein each storage capacitor comprises a dynamic random access memory (DRAM) storage cell.

4. The memory device according to claim 1, wherein the gate insulating layer comprises a gate oxide.

5. The memory device according to claim 1, wherein the channel has a radius of curvature is between about 60 to 250 nm.

6. A vertical transistor, comprising:
    a semiconductor wafer having a surface; and
    a vertical transistor formed in the semiconductor wafer, the vertical transistor including a source region proximate to the wafer surface and a drain region vertically spaced from the wafer surface, the transistor further including a curved channel having a depletion width located within the semiconductor wafer substantially perpendicular to the semiconductor wafer surface between the source region and the drain region, and wherein the channel is convex and has a radius of curvature that is substantially greater than the depletion layer width so that the vertical transistor has a threshold voltage of not more than 0.25V.

7. A vertical transistor comprising:
    a semiconductor wafer having a surface;
    at least one trench formed in the semiconductor wafer, the trench including a top portion, wherein the vertical transistor is formed in the top portion of the trench;
    a curved channel disposed within the semiconductor wafer and substantially perpendicular to the semiconductor wafer surface wherein the curved channel is concave and has a radius of curvature and a depletion layer width that is much smaller than the radius of curvature so that the transistor has a body factor of at least 1.02 $V^{1/2}$ and a threshold voltage of at least 0.42V;

a source region formed in the semiconductor wafer proximate the wafer surface above the curved channel and along a sidewall of the trench; and a drain region formed in the semiconductor wafer below the curved channel, wherein the curved channel is disposed vertically between the source and drain regions.

8. The vertical transistor according to claim 7, wherein the trench includes a bottom portion disposed beneath the trench top portion, further comprising a storage capacitor formed in the trench bottom portion.

9. The vertical transistor according to claim 8, wherein the storage capacitor comprises a dynamic random access memory (DRAM) storage cell.

10. The vertical transistor according to claim 7, wherein the radius of curvature is between about 50 to 300 nm.

11. The vertical transistor according to claim 7, wherein the vertical transistor includes a gate oxide disposed adjacent the curved channel, and a gate conductor disposed adjacent the gate oxide.

12. A dynamic random access memory (DRAM) cell comprising:

a trench formed in a semiconductor region, the trench having a cross-sectional shape of an oval or an ellipse;

a storage capacitor disposed in a lower portion of the trench;

a first gate insulating layer portion disposed adjacent one sidewall of the trench and a second gate insulating layer portion disposed adjacent an opposite sidewall of the trench, the first gate insulating layer portion being separated from the second gate insulating layer portion;

a gate region disposed within a portion of the trench above the storage capacitor, the gate region extending between the first gate insulating layer portion and the second gate insulating layer portion;

a source region disposed in the semiconductor region along a sidewall of the trench, the source region being electrically coupled to the storage capacitor;

a channel region disposed in the semiconductor region along the sidewall of the trench, the channel region being adjacent the gate region, the channel region being curved; and a drain region disposed in the semiconductor region along the sidewall of the trench so that the curved channel region is disposed vertically between the source region and the drain region.

13. The DRAM of claim 12, wherein the semiconductor region comprises a semiconductor substrate.

14. The DRAM cell of claim 12, wherein the radius of curvature is between about 50 nm to about 300 nm.

* * * * *